(12) United States Patent
Blankenship (10) Patent No.: US 7,872,936 B2
(45) Date of Patent: Jan. 18, 2011

(54) SYSTEM AND METHOD FOR PACKAGED MEMORY

(75) Inventor: Dennis Blankenship, Cary, NC (US)

(73) Assignee: Qimonda AG, München (DE)

( * ) Notice: Subject to any disclaimer, the term of this patent is extended or adjusted under 35 U.S.C. 154(b) by 202 days.

(21) Appl. No.: 12/212,400

(22) Filed: Sep. 17, 2008

(65) Prior Publication Data

US 2010/0070696 A1    Mar. 18, 2010

(51) Int. Cl.
*G11C 8/00* (2006.01)
(52) U.S. Cl. ............... 365/230.03; 365/230.01; 365/189.04; 365/233.11; 365/189.19; 365/201
(58) Field of Classification Search ............ 365/230.03, 365/230.01, 189.04, 189.18, 189.19, 233.1, 365/233.11
See application file for complete search history.

(56) References Cited

U.S. PATENT DOCUMENTS 7,461,199 B2 * 12/2008 Conley et al. ............... 711/103
2007/0014168 A1 * 1/2007 Rajan ........................ 365/201

OTHER PUBLICATIONS

Qimonda, "HYB18TC1G800C2F HYB18TC1G160C2F 1-Gbit Double-Data-Rate-Two SDRAM DDR2 SDRAM EU RoHS Complaint Products," Rev. 1.10, Internet Data Sheet, www.quimonda.com, Jul. 2008, pp. 1-63.

* cited by examiner

*Primary Examiner*—Thong Q Le
(74) *Attorney, Agent, or Firm*—Coats & Bennett, P.L.L.C.

(57) ABSTRACT

In one embodiment, a memory system is disclosed. The memory system has at least one memory chip having an address and data interface coupled to an internal address and data bus, and a memory controller and interface chip also having a an address and data interface coupled to the address and data interface of the at least one memory chip via an internal address and data bus. The at least one memory chip, the memory controller and interface chip and the internal address and data bus are disposed within a common chip package. The memory controller and interface chip has an external interface configured to be coupled to a standard memory bus via external contacts of the common chip package.

31 Claims, 9 Drawing Sheets

SYSTEM AND METHOD FOR PACKAGED MEMORY

TECHNICAL FIELD

This invention relates generally to semiconductor circuits, and more particularly to a system and method for packaged memory.

BACKGROUND

Semiconductor devices are used for integrated circuits in a variety of electrical and electronic applications, such as computers, cellular telephones, radios, and televisions. One particular type of semiconductor device is a semiconductor storage device, such as a random access memory (RAM) device. Many RAM devices include many storage cells arranged in a two-dimensional array with two sets of select lines, word lines and bit lines. An individual storage cell is selected by activating its word line and its bit line. RAM devices are considered "random access" because any memory cell in an array can be accessed directly if the row and column that intersect at that cell are known.

A commonly used form of RAM is known as a dynamic RAM (DRAM) device. Dynamic random access memory has memory cells with a paired transistor and capacitor, wherein the capacitor requires periodic refreshing. One particular type of DRAM device is a synchronous DRAM (SDRAM) device, in which the memory cells are accessed synchronously. Synchronous dynamic random access memory often takes advantage of the burst mode concept to greatly improve performance by staying on the row containing the requested bit and moving rapidly through the columns. To achieve a high-speed operation, a double data rate (DDR) architecture is often used, during which two data transfers are made per clock cycle, one upon the rising edge of the clock and the other upon the falling edge.

As portable electronic devices become smaller, less expensive, and more power efficient, however, there has been an increased demand for low power and compact electronic systems in which DRAM is commonly used. Consequently, systems and methods are needed to reduce the size, power and cost of memory systems.

SUMMARY OF THE INVENTION

In one embodiment, a memory system is disclosed. The memory system has at least one memory chip having an address and data interface coupled to an internal address and data bus, and a memory controller and interface chip also having an address and data interface coupled to the address and data interface of the at least one memory chip via an internal address and data bus. The at least one memory chip, the memory controller and interface chip and the internal address and data bus are disposed within a common chip package. The memory controller and interface chip has an external interface configured to be coupled to a standard memory bus via external contacts of the common chip package.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a system and method for a packaged DRAM memory. Embodiments of this invention may also be applied to other circuits and systems that require area and power efficient use of a memory device.

Figure 1:
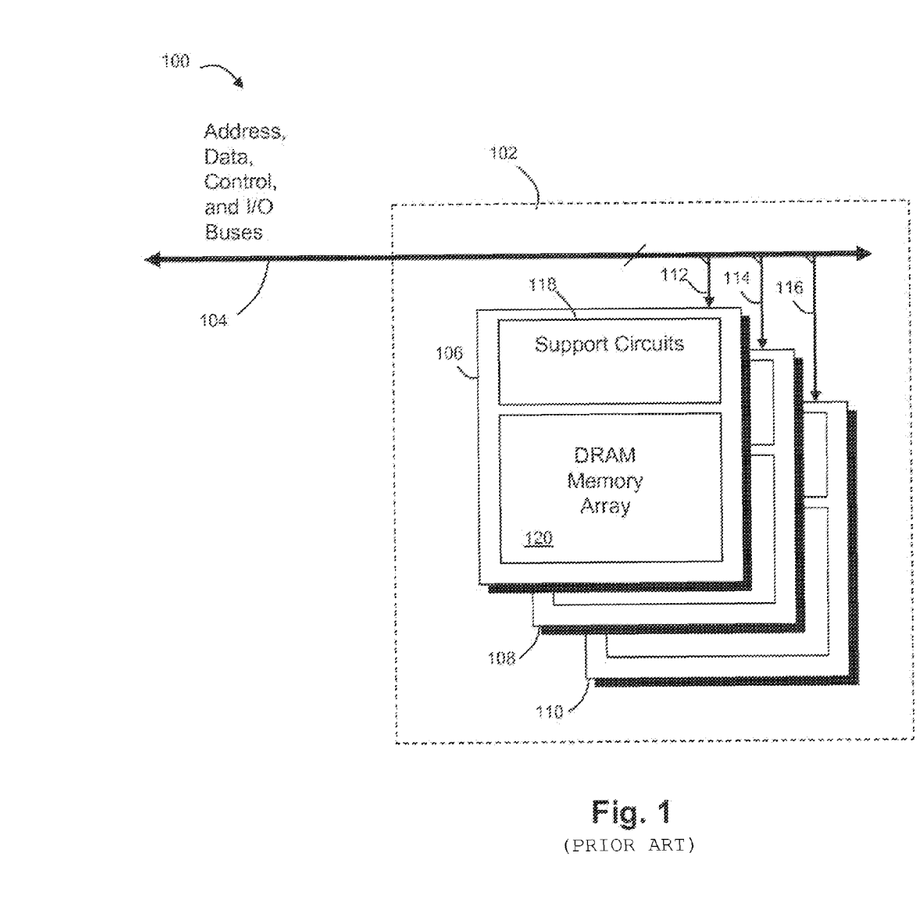
FIG. 1 illustrates a conventional packaged DRAM memory system.

A known packaged memory system 100 is shown in FIG. 1, which shows DRAM memory integrated circuits (ICs) 106, 108 and 110 housed together in package 102. Generally DRAM ICs 106, 108 and 110 are stacked on top of each other within the same package. Three DRAM ICs 106, 108 and 110 are shown for simplicity of illustration, however, greater or fewer than three DRAM ICs can be housed in a single package. Bus 104 represents an address, control and data bus, which is routed to each of DRAM ICs 106, 108 and 110 at least partially in parallel.

Typically, each DRAM IC within package 102 is the same type of integrated circuit having identical circuitry, layout and pad locations. Each DRAM IC typically has a DRAM memory array 120 and associated support circuits 118. DRAM memory array 120 is generally a very dense storage array containing up to 1 billion or more individual storage cells fabricated in a specialized process. Each DRAM IC also has support circuits 118, which are typically circuits such as bit-line drivers, word-line drivers, clock generators, error correction circuits, supply voltage generators, ODT circuits, refresh control circuits, and I/O circuits for example. Because DRAM memory cells are usually fabricated in a special process that is optimized for data storage and not general logic circuitry, support circuits are typically implemented with non-optimized logic requiring more die area and consuming more power than an optimized solution in a state-of-the-art process.

Each DRAM IC 106, 108 and 110 in most conventional applications are designed to operate according to a particular memory interface standard such as DDR, DDR2, and DDR3. Busses implemented according to these standards may have to operate at speeds over 1 Gb/s and clock speeds over 500 MHz. Most DRAM standards allow for the addressing of very large blocks of memory by allowing for multiple DRAM chips to share and interface to a parallel data, control and address bus. The data, control and address bus 104 for most DRAM standards require controlled bus termination to maintain adequate signal integrity at high bus speeds. Because high bus capacitance resulting from multiple DRAM ICs sharing the bus, interface driver circuits on each DRAM chip consume considerable die area and power in order to drive a the address, data and control bus. For example, if a typical DRAM IC interface pin has a capacitance of greater than 4 pF. A loaded DDR2 memory bus having eight DRAM ICs can have an input capacitance of greater than 32 pF due to input capacitance alone, assuming a loaded bus having eight DRAM ICs. When board parasitics are taken into account, the total capacitance seen at each memory bus line can be even higher.

In applications where multiple DRAM die share the same package, package pins are bonded to pads of each of the multiple DRAM in parallel. For example, a package pin corresponding to an LSB of a data bus is routed to each corresponding data bus LSB pad on the DRAM IC. Although multiple DRAM ICs are routed together and placed in the same package, each DRAM IC operates independently without sharing circuit resources, according to conventional implementations.

Furthermore, in a circuit or system using multiple DRAM sharing the same package, upgrading the circuit or system to use multiple DRAM, or multiple DRAM in a single package can be challenging because of circuit characteristics that vary according to number and type of DRAM ICs within a package. For example, doubling the memory capacity of a particular design may be straightforward from a logic design point of view, but may require a circuit designer to redesign the circuit board and re-specify other circuit components that interface with the DRAM IC's in order to deal with increased bus capacitance, and changes in other circuit parameters.

Figure 2:
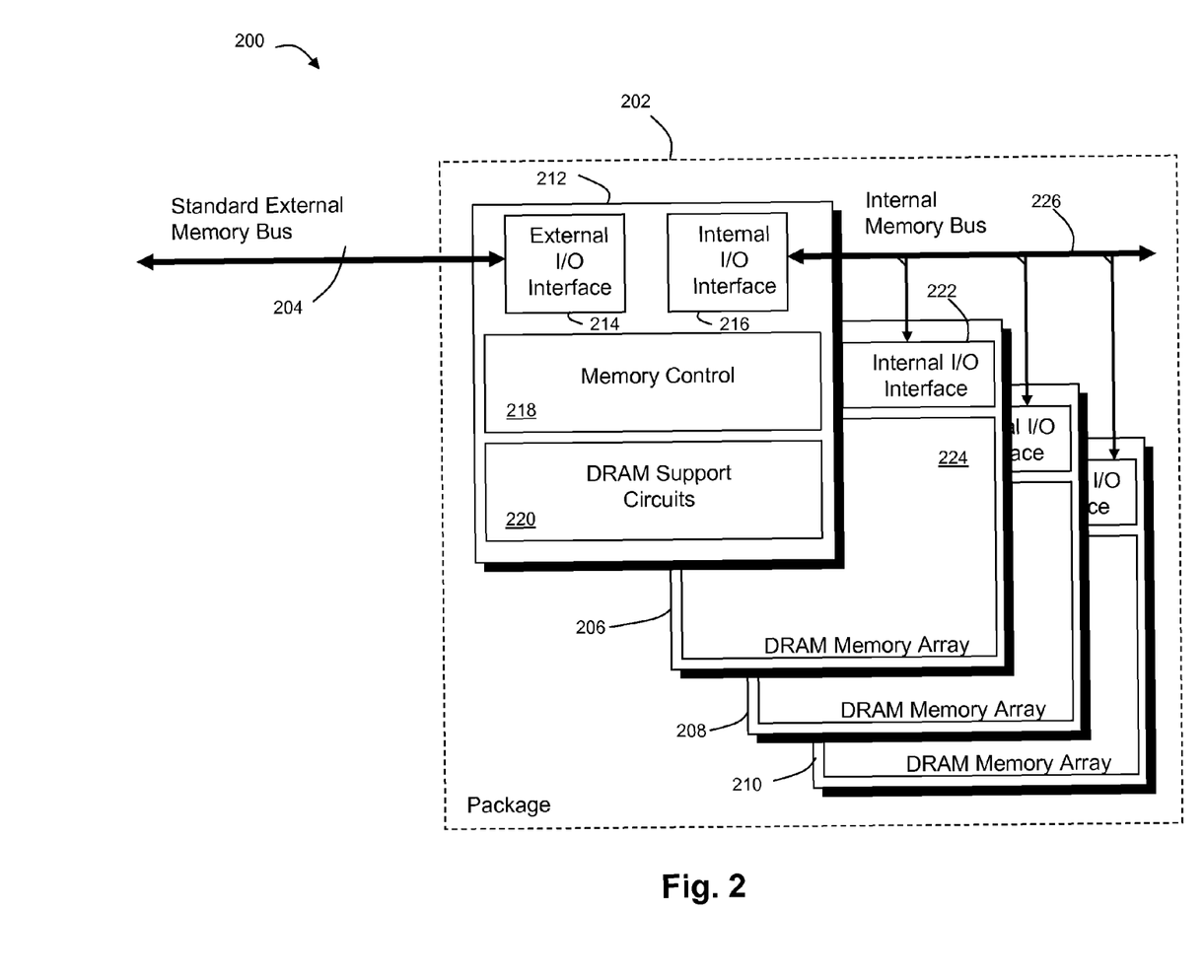
FIG. 2 illustrates a packaged DRAM memory system according to a preferred embodiment.

Turning to FIG. 2, multiple package DRAM memory system 200 according to a preferred embodiment of the present invention is shown. Package 202 has DRAM memory ICs 206, 208 and 210, which is controlled by memory controller and interface (MCIF) IC 212. While only three DRAM ICs 206, 208 and 210 are shown for simplicity of illustration, greater or fewer DRAM die can be encapsulated within package 202. Preferably, the number of DRAM ICs is a power of 2, for example, 4, 8 or 16 DRAM ICs. Other embodiments, can have any number of DRAM ICs. Conceptually, the contents of package 202 appears and functions to the outside world as a single DRAM IC at external I/O interface 214. By controlling DRAM ICs 206, 208 and 210 via internal bus 226, system performance variation due to the number of DRAM IC die present in package 202 is eliminated.

Each DRAM IC 206, 208 and 210 has DRAM memory array 224, internal I/O interface 222, as well as a basic set of required support circuitry (not shown) such as word-line drivers and bit-line drivers. MCIF IC 212 has an external I/O interface 214, internal I/O interface 216, memory control 218 and DRAM support circuit 220. External I/O interface 214 is coupled to memory bus 204 and preferably operates according to a memory standard, for example, a JEDEC DDRx standard such as DDR, DDR2, or other standards. Alternatively, internal I/O interface 216 can be configured to operate according to specialized or proprietary standards depending on the application.

External I/O interface 214 of MCIF IC 212 is coupled to internal memory bus 226, which is physically made of electrical connections (not shown) between ICs within package 202 and/or between a package substrate (not shown). Internal I/O interface of DRAM ICs 206, 208 and 210 are coupled to internal memory bus 226 as well, preferably in a synchronous, non-differential, parallel structure. In alternative embodiments, other schemes may be used such as differential, parallel, synchronous and asynchronous low-speed serial, synchronous differential, high-speed serial, and other schemes. Bonding connections of internal I/O interface bus 222 are implemented according to the particular packaging technology being used. For example, electrical connections can be implemented with wire bonds, bump bonds, through silicon vias, or other conventional bonding methods.

In embodiments of the present invention, internal memory bus 226 could logically operate according to a DRAM interface standard such as DDR, DDR2 or DDR3, for example, in terms of logic levels and timing, but not necessarily with regard to impedance levels and drive strength requirements. Alternatively, internal memory bus 226 may operate according to a bus scheme optimized for the particular application. From a physical circuit standpoint, however, internal I/O interface 222 is preferably optimized to operate locally within package 202. Whereas conventional DRAM interfaces have high current output drivers and termination resistances of between about 20Ω and 100Ω, driver devices within internal I/O interface 222 are preferably implemented using smaller, lower current devices using higher interface impedances. This saves die area and conserves power compared to conventional DRAM implementations. Alternative embodiments of the present invention can use higher power devices, or use interface devices compliant with conventional DRAM interface standards if required by a particular application.

Memory controller and interface circuit 212 also has DRAM support circuits 220, used to support operation of DRAM ICs 206, 208 and 210. These circuits, such as supply generators and clock generators and refresh circuits, for example, are coupled to DRAM ICs 206, 208 and 210 via electrical connections (not shown). DRAM ICs 206, 208 and 210, according to preferred embodiments, require only a minimal amount of support circuitry compared to conventional DRAM ICs. For example, if MCIF IC 212 has supply voltage generation circuits, DRAM ICs 206, 208 and 210 do not require on-chip voltage generation circuits. Power and die area can, therefore, be conserved by eliminating redundant support circuits within package 202. It should be noted that the partitioning of support circuits between memory controller and interface circuit 212 and DRAM ICs 206, 208 and 210 varies according to system requirements and according the particular embodiment implemented.

It can be seen that other types of memory and circuits besides DRAM can be encapsulated within package 202 in alternative embodiments. For example, memory types such as NOR flash, NAND flash, MRAM, RD RAM, PRAM, PSRAM, MobRAM, and other types can be also used. Non-memory circuits such as DSP processors, or other specialized circuits configured to share a bus, can be used as well.

Figure 3:
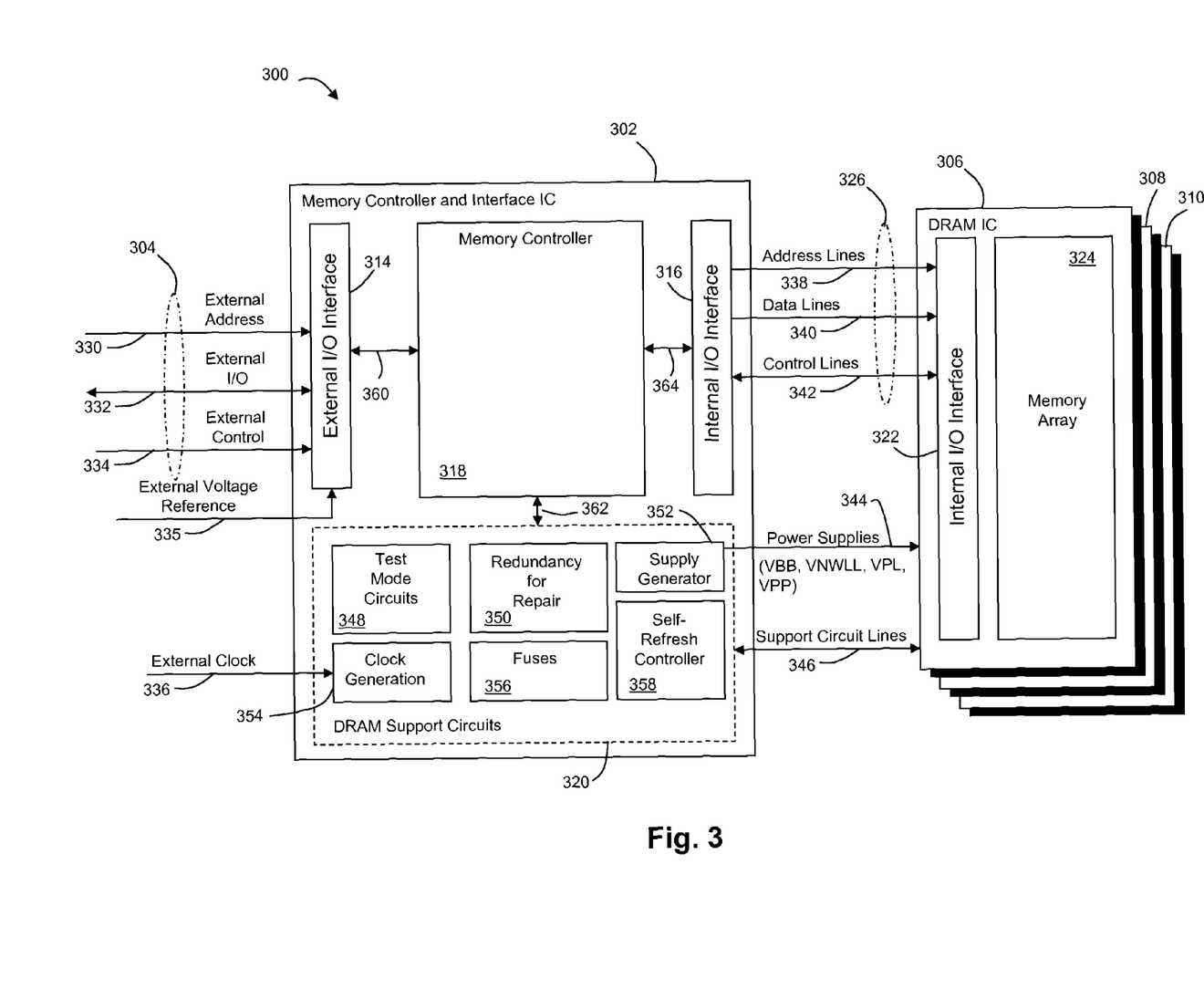
FIG. 3 illustrates a schematic of a chipset for a packaged DRAM memory system according to a preferred embodiment.

FIG. 3 shows a schematic of chipset 300 for a packaged DRAM memory system according to a preferred embodiment of the present invention. MCIF IC 302 is coupled to DRAM ICs 306, 308 and 310 via internal memory bus 326, power supply lines 344 and support circuit lines 346. Likewise, external memory bus 304 is coupled to external I/O interface 314 of MCIF IC 302. All ICs 302, 306, 308 and 310 are preferably housed and/or encapsulated within the same system or package (not shown) as described hereinabove. In alternative embodiments, Package on Package (POP) technique can be used, where MCIF IC 302 is placed in its own package and connected to a stack of memory devices, which are also placed in a separate package.

External memory bus 304 is made of external address bus 330, external I/O bus 332, and external control bus 334, which preferably operates according to a conventional DRAM standard such as DDR, DDR2 and DDR3, for example. Similarly, internal memory bus 326 has address lines 338, data lines 340 and control lines 342 coupled to internal I/O interfaces 316 and 322 of the MCIF IC 302 and DRAM IC's 306, 308 and 310. DRAM support circuit 320 resident on MCIF IC 302 preferably has power supply lines 344 and support circuit lines 346 coupled to DRAM ICs 306, 308 and 310. Memory controller 318 preferably controls the operation of external I/O interface 314, internal I/O interface 316 and DRAM support circuits 320 via on-chip interfaces 360, 364 and 362, respectively. In alternative embodiments of the present invention, MCIF IC 302 may be organized and architected in a manner different from the schematic shown in FIG. 3. For example, MCIF IC 302 can contain internal memory bus 326 and external memory bus 304, yet require stacked DRAM IC's, 306, 308, and 310 to obtain their power supply from external package inputs and include support circuits 346 on each individual DRAM IC. Similarly, in further alternative embodiments of the present invention, any combination of various inputs and outputs to the MCIF IC 302 and the DRAM IC's 306, 308, and 310 can be implemented.

To perform a read operation according to a preferred embodiment, an address is supplied on external address bus 330 and a read instruction is supplied on external control bus 334 to external I/O interface 314, according to the particular standard being used. External reference voltage 335 provides a bias or reference voltage for the internal input receivers inside external I/O interface 314. Memory controller 318 maps the address to the address space of DRAM ICs 306, 308 and 310, and issues a mapped address on internal address lines 338 and a read command on internal control lines 342 from the internal I/O interface 316. Once the target DRAM receives the address and read command, a memory read operation is performed and read data is written on internal data lines 340. Memory controller 318, then inputs the read data from internal I/O interface 316, and outputs the read data on external I/O interface 314, thereby making the read data available on external I/O bus 332.

Likewise, to perform a write operation, an address is supplied on external address bus 330, write instruction is supplied on external control bus 334, and write data is supplied on external I/O bus 332 to external I/O interface 314, according to the particular standard being used. Memory controller 318 maps the address to the address space of DRAM ICs 306, 308 and 310, issues a mapped address on internal address lines 338, a write command on internal control lines 342, and provides read data on internal data lines 340 from internal I/O interface 316. The target DRAM IC receives the write command, mapped write address and write data from internal memory bus 326 to internal I/O interface 322, and then performs a memory write operation.

In alternative embodiments of the present invention, other read and write methods and sequences can be used. For example a serial interface could be utilized where data, address, and command share I/O's (or some combination of these, e.g., address and command could share pins, and data would have a dedicated bus). In such a configuration, frames of information could be utilized to move data to and from the MCIF IC. This same configuration could either be used on the individual DRAM ICs, or a configuration according to preferred embodiments described hereinabove.

In preferred embodiments of the present invention, DRAM support circuit 320 has test mode circuit 348, redundancy for repair circuit 350, supply generator 352, clock generation circuit 354, fuses 356 and self-refresh controller 358. In alternative embodiments, DRAM support circuit 320 may contain other circuits or omit some of the circuits shown in FIG. 3. For example, DRAM support circuit 320 may additionally have a temperature sensing circuit, or the redundancy for repair circuit 350 may be omitted if partitioning repair circuit 350 on DRAM ICs 306, 308, and 310 is more cost effective.

Test mode circuits 348 are generally used for a number of testing applications in memory chips. Typically, the test mode circuits are used to adjust voltages and timings to allow for a more detailed characterization of the memory chip. These test mode circuits typically require some form of digital and/or analog circuitry to implement. In conventional memory system implementations, test mode circuit 348 is instantiated on multiple DRAM ICs. In preferred embodiments, however, test mode circuit 348 is present on the memory controller and interface IC only, and interfaced to DRAM ICs 306, 308 and 310 via support circuit lines 346. In preferred embodiments of the present invention, many test modes can be achieved using less die size than conventional embodiments. Additionally, new test modes that were previously not possible (that apply to all DRAM ICs in the package) can also be implemented.

In preferred embodiments of the present invention, clock generation circuit 354 generates clock signals used in the MCIF IC 302 and DRAM ICs 306, 308 and 310. External clock 336 is supplied to clock generation circuit 354 in MCIF IC 302. Clock generation block 354 has a combination of circuit blocks, such as delay line loops (DLL), clock multiplying phase locked loops (PLL), frequency dividers, synchronous mirror delays and other clock generation circuits, for example. The specific types of circuits included in clock generation block 354 depend on the memory application and standard used. For example, in some high speed graphic DRAM IC standards, the external clock is specified to operate in a single-ended mode at frequencies near 500 MHz. With a 500 MHz external clock input, a 2 GHz internal clock (using 4× multiplexing) can be generated to provide clocking to DRAM IC's via support lines 346. In some slower speed DRAM IC standards, the external clock frequency and the internal clock frequency (provided via support lines 346) could be the same, e.g., about 100 MHz. In this example, the clock generation block 354 could simply be buffers that pass the clock signal to the support lines 346. In alternative embodiments of the present invention, clock generation block 354 may be more or less comprehensive than the above examples. For example, some embodiments may omit one or more of the above-mentioned blocks, or provide other clock generation circuits and devices known in the art.

Redundancy for repair block 350 is preferably provided to correct for errors detected in memory array 324 in DRAM ICs 306, 308 and 310. Redundancy for repair block 350 can be implemented in a number of ways. For example, in the preferred embodiment, a small cache RAM (not shown) and supporting logic can be utilized to track the address locations of bad memory cells on DRAM ICs 306, 308 and 310. If an address mapping to one of these bad memory cell locations is asserted on external address bus 330, data is written and/or read from the cache RAM in redundancy for repair block 350 instead of DRAM ICs 306, 308 and 310. By having redundancy for repair block 350 on the MCIF IC 302 instead of on DRAM ICs 306, 308 and 310, both power and die area are saved. Furthermore, locating redundancy for repair block 350 on MCIF IC 302 is advantageous because it allows for calibration and repair of bad memory locations late in the manufacturing process. For example, after chipset 300 has been stacked and packaged. In alternative embodiments of the present invention, redundancy for repair block 350 may have larger blocks of memory cells that can be mapped directly to failing memory locations on one of the DRAM IC's, 306, 308, 310. One could also place Error Correction Circuitry (ECC) along with the redundancy for repair block 350. It is also possible to utilize different types of memory for the cache memory of redundancy for repair block 350, e.g., Dynamic Random Access Memory (DRAM), Static Random Access Memory (SRAM), Electrically Programmable Memory (EPROM), FLASH Memory, etc.

Fuse block 356 contains fuses for parametric trimming. For example, parameters such as voltage references, preferred operation modes, and device options, can be programmed anytime during the manufacturing process. By having all fuses adjust a common set of parameters on MCIF IC 302, not only is die area saved, but test and trim time is reduced compared with conventional embodiments where each separate DRAM IC can have an individual set of trimmable parameters. Fuses are preferably implemented by electronically or laser blowable fuse links using materials such as tungsten or polysilicon. Alternatively, non-volatile memory such as EEPROM can be used. In further alternative embodiments, the fuse block may not be present on the MCIF IC 302.

Self-refresh controller 358 controls the operation of a self-refresh mode for DRAM ICs 306, 308 and 310 via support circuit lines 346. Self-refresh controller 358 enables a low power self-refresh mode that reduces the frequency of DRAM refresh operations, thereby saving system power. By having the self-refresh controller on MCIF IC 302, die area is saved, as compared with conventional embodiments where each separate DRAM IC can have a self-refresh controller. Alternative embodiments of the present invention may include other types of refresh controllers on the memory controller and interface IC. In other embodiments, the self-refresh controller can be omitted.

Supply generator 352 generates power supply voltages supplied to DRAM ICs 306, 308 and 310 via power supply lines 344. In preferred embodiments, supply generator 352 generates back bulk voltage VBB used to bias the bulk of DRAM cell transistors, NWELL bias voltage VNWLL, plate voltage VPL used for the DRAM array and voltage VPP used to produce word line voltages. In preferred embodiments, VBB is approximately 0 to −0.5V, VNWLL is about −0.5V, VPL is about 0.8V, and VPP is about 2.2V. VNWLL and VPP are preferably generated using charge pump and other voltage boosting techniques because these voltages lie outside the nominal supply range of 1.8V. In alternative embodiments, other power supply generation schemes may be used and/or other voltages besides voltages mentioned hereinabove may be generated.

Locating supply generator 352 on MCIF IC 302 is advantageous because area and power is saved by not instantiating these blocks on DRAM ICs 306, 308 and 310, since circuit components in power supply generation blocks can require a significant amount of area. Furthermore, processes used to fabricate conventional DRAM ICs may not necessarily be optimized for the voltage reference and supply boosting circuits supporting DRAM devices. Therefore, if memory controller and interface circuit is fabricated in a process that is optimized for such circuits, additional area savings and/or performance benefits can be realized.

Figure 4:
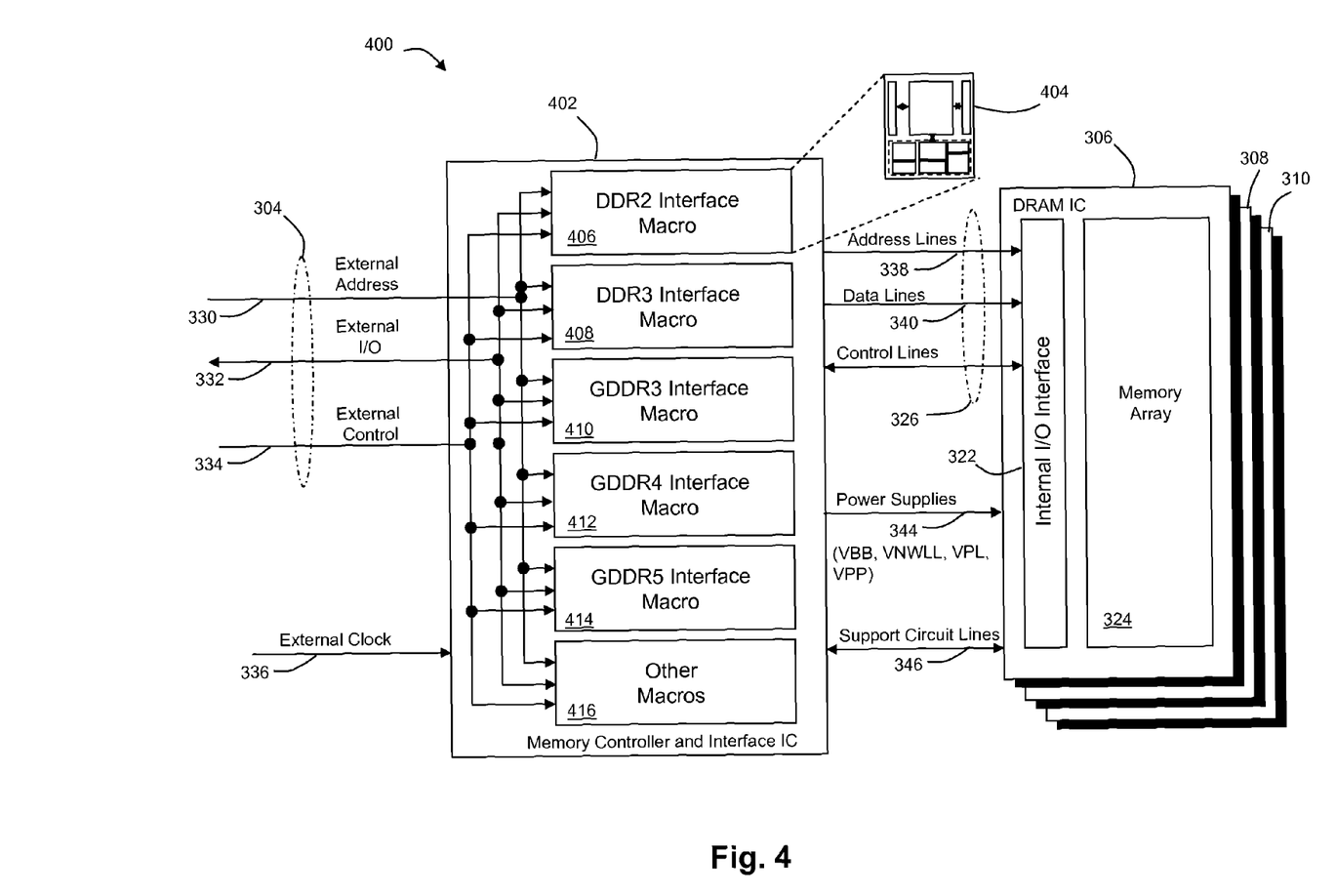
FIG. 4 illustrates a schematic of a chipset for a packaged DRAM memory system according to a further preferred embodiment.

Turning to FIG. 4, a further preferred embodiment memory chipset 400 is shown. Chipset 402 has a MCIF IC 402 coupled to DRAM IC's 306, 308 and 310 via internal interface bus 326. MCIF IC 402 is coupled externally to external interface bus 304. External clock 336 is provided to, and power supply lines 344 and support circuit lines 346 are provided from DRAM support circuits (not shown) on MCIF IC 402.

In a preferred embodiment, MCIF IC 402 has a plurality of circuit macros 406, 408, 410, 412, 414 and 416, each of which implement a particular DRAM standard or other interface standard. Each macro has control, I/O and support circuitry needed to interface between external memory bus 304 and internal bus 326 for each of these particular standards. Graphic 404 is representative of MCIF IC 302 (FIG. 3) and denotes that each macro has control and interface functionality similar to embodiments of the present invention as described hereinabove.

MCIF IC 402 has DDR2 interface macro 406, DDR3 interface macro 408, GDDR3 interface macro 410 (for graphic DRAM), GDDR4 interface macro 412, GDDR5 interface macro 414, and other macros 416 such as XDR and FBDIMM/AMB, etc. It should be noted that this particular macro set is shown for illustrative purposes. Other embodiments of the present invention may have a different set of macros, or have macros implementing other standards. The activation of each macro is preferably enabled by blowing fuses or by selection by metal option.

In preferred embodiments of the present invention, each macro is a complete circuit block optimized for a specific memory standard. For example, DDR2 interface macro 406 can have a complete set of circuit components independent from all other macros such as DDR3 interface macro 408. In alternative embodiments, however, the macros can share circuits and functionality determinable by modifying programmable parameters or by reconfiguring programmable logic.

FIGS. 5*a*-5*d* illustrate exemplary packaged die configurations according to embodiments of the present invention. A multitude of other configurations are also possible.

Figure 5A:
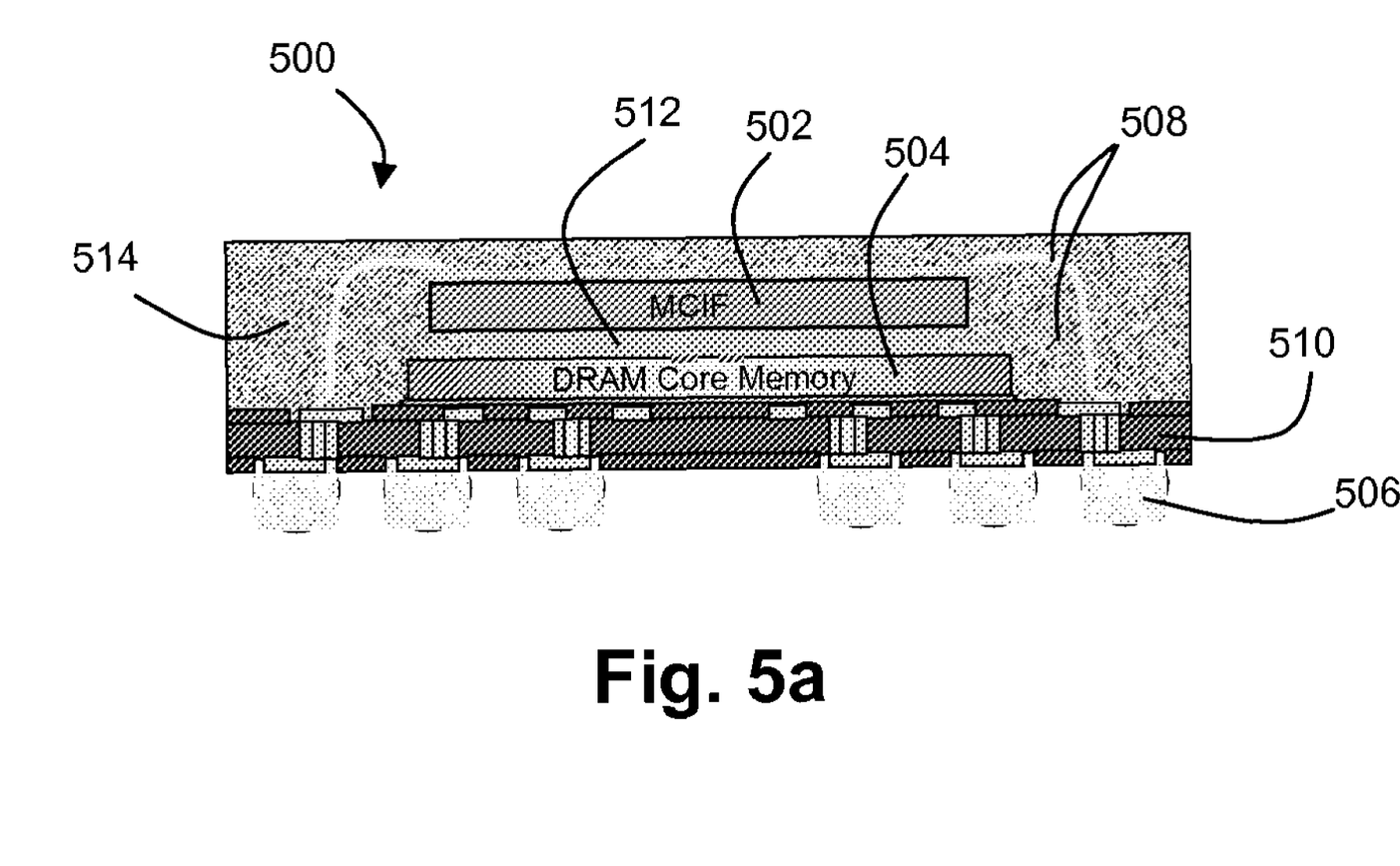
FIGS. 5a-5e illustrate packaged die configurations according to embodiments of the present invention.

FIG. 5*a* shows a single BGA package 500 having DRAM IC 504 mounted on substrate 510. MCIF IC 502 is stacked on interposer 512, which is mounted on top of DRAM IC 504. DRAM IC 504 and MCIF IC 502 are bonded to substrate 510 via bond wires 508. External interface signals are routed through to solder-ball contacts 506. Encapsulant 514 covers and seals the components within package 500. In alternative embodiments of the present invention, different package types can be used in place of BGA package 500, for example, PGA, PLCC, TSOP and other types of packages.

Figure 5B:
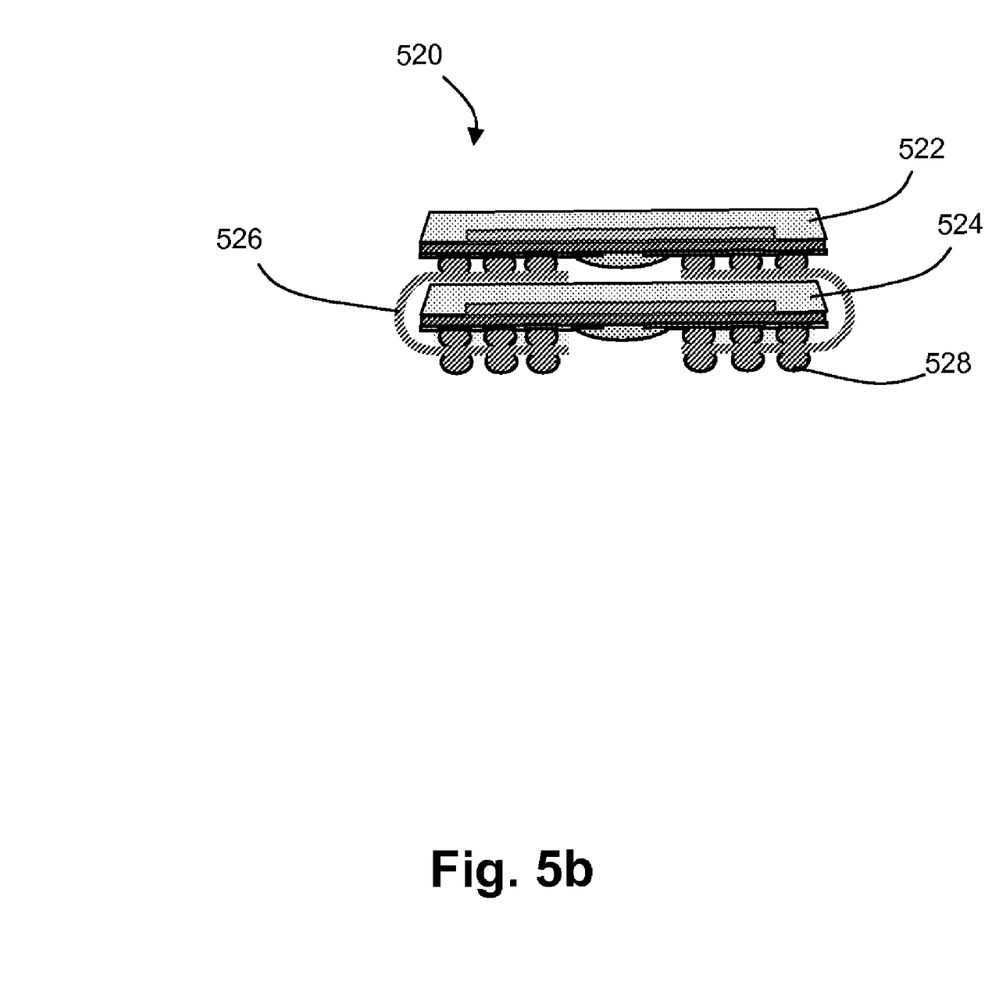

FIG. 5*b* shows memory system 520 having two packages 522 and 524, each having a single die. One package contains an MCIF IC, and the other package contains a DRAM IC. Packages 522 and 524 are interfaced using interconnect 526, which is preferably a flex material that simply connects the two devices, 522 and 524, through embedded metal traces. Contacts 528 are shown as solder balls and are mounted on a circuit board in a target application. In alternative embodiments, other circuit board contact implementations, such as pins, can be used.

Figure 5C:
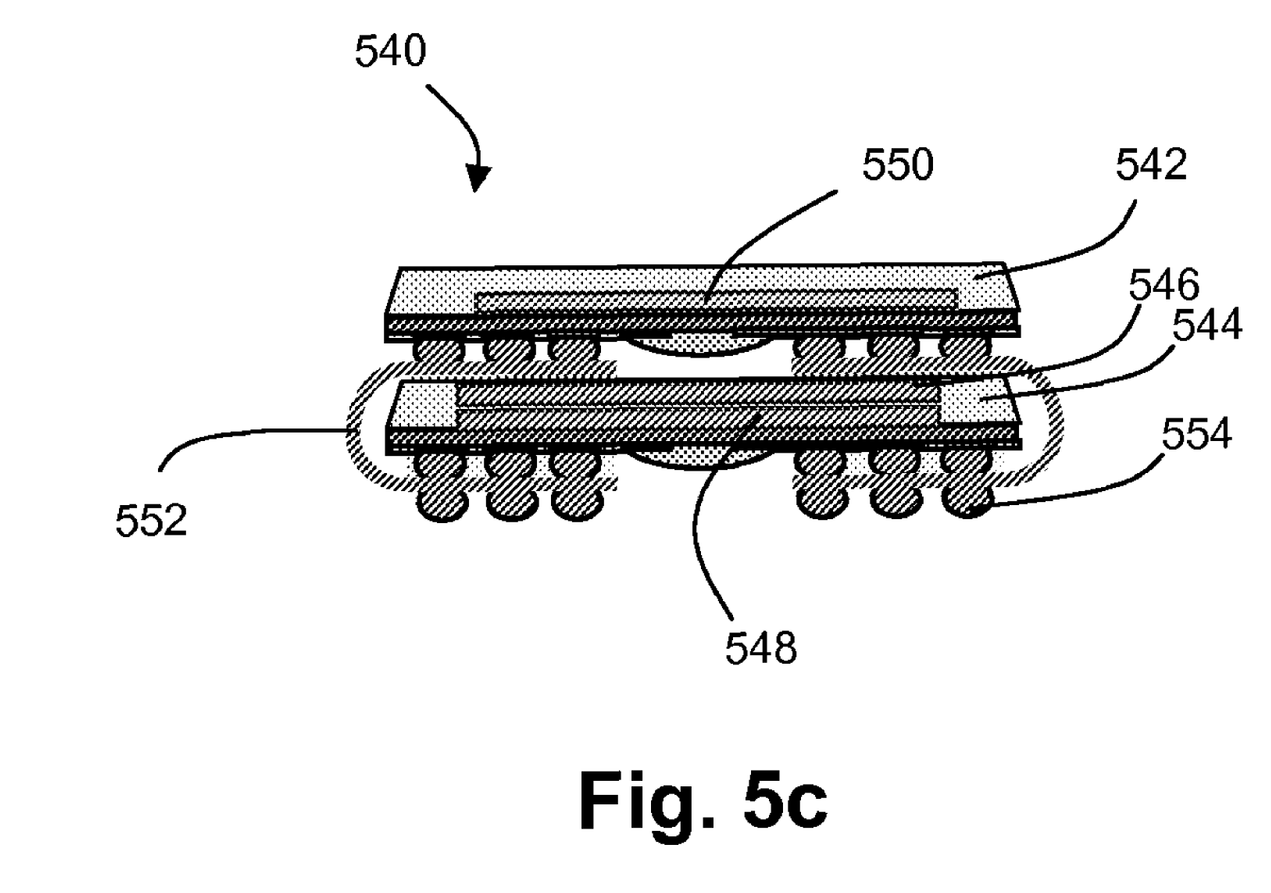

FIG. 5*c* shows memory system 540 having two packages 542 and 544 according to an embodiment of the present invention. Package 542 houses MCIF IC die 550, and package 544 houses DRAM IC die 546 and 548. MCIF IC die 550 is interfaced to DRAM IC die 546 and 548 via interconnect 552.

Solder balls 554 interface to a system board (not shown). In alternative embodiments of the present invention, package 542 can be placed on the bottom and package 544 can be placed on top, two DRAM IC die can be encapsulated within package 544, additional packaged DRAM devices can also be added to the stack of packages, for example.

Figure 5D:
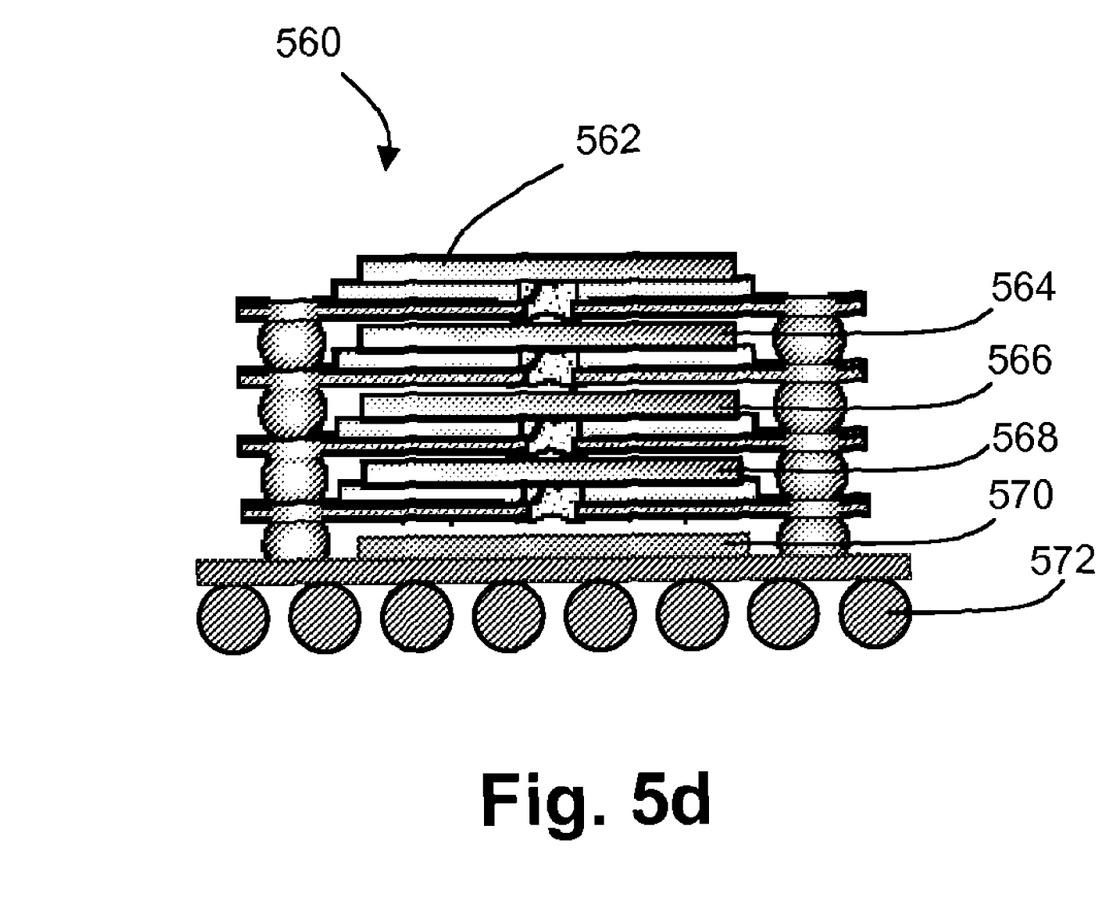

FIG. 5d shows a single stacked package memory system 560 having multiple stacked die 562, 564, 566, 568 and 570. One of these die is preferably an MCIF IC, while the remaining die are DRAM ICs. These die are interconnected between each other by lead frames having aligned connection points that can be stacked on top of other similarly configured lead frames, and interfaced to a board via solder balls 572. In alternative embodiments of the present invention, greater or fewer DRAM IC die may be present within package 560.

Figure 5E:
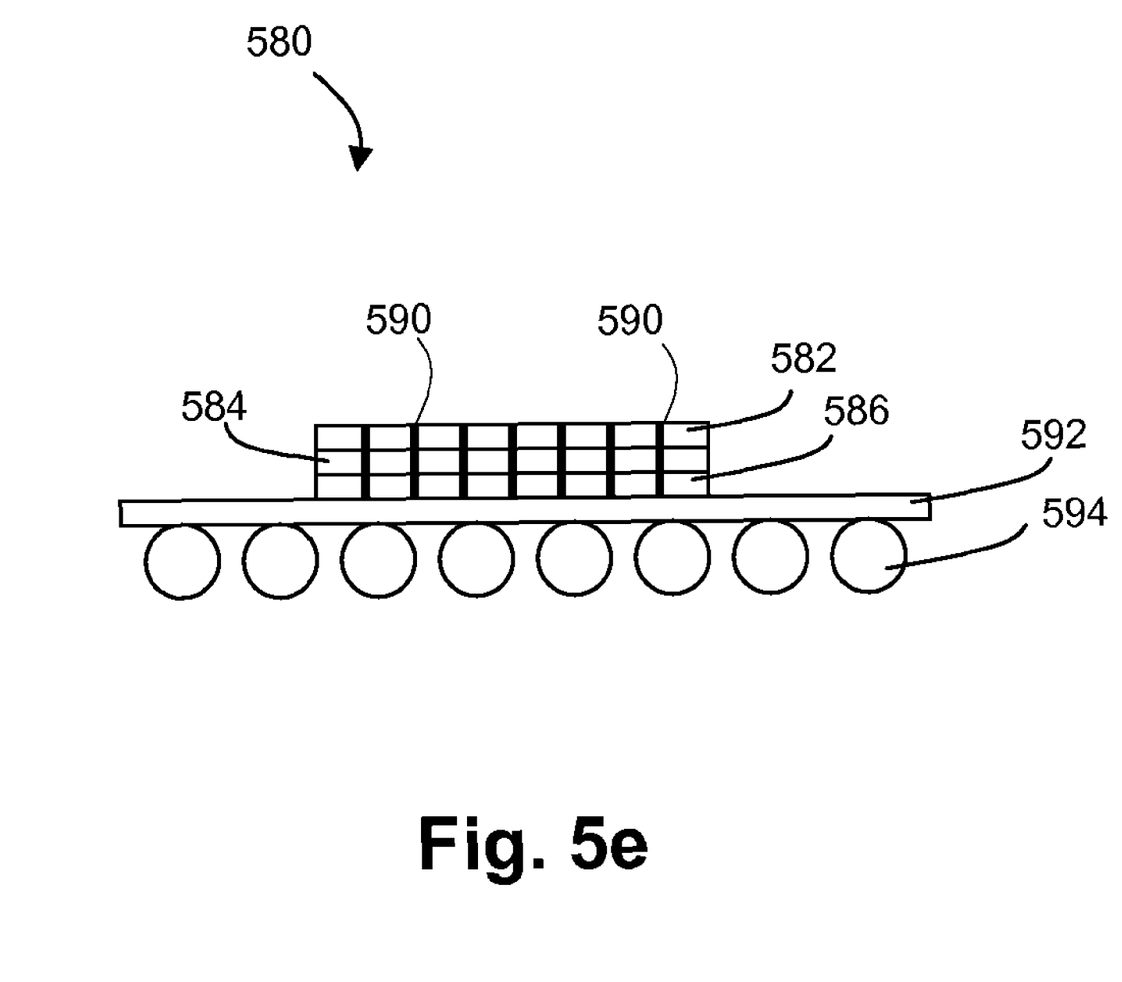

FIG. 5e shows a stacked packaged memory system 580 having multiple stacked die 582, 584 and 586 coupled together with through silicon vias 590. One of these die is preferably an MCIF IC, while the remaining die are DRAM ICs. The die are interfaced to substrate 592 and externally coupled via solder balls 594. In alternative embodiments, other types of external connections, such as pins, may be used.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A multi-chip memory device comprising:
   a plurality of stacked semiconductor die comprising
   a plurality of memory die,
   a memory controller and interface die, wherein the plurality of memory die and the memory controller comprise a single stack of die;
   a plurality of bonded connections, the bonded connections coupling an internal interface of the memory controller with an internal interface of each of the plurality of memory die; and
   a plurality of pins coupled to an external interface of the memory controller and interface die.

2. The multi-chip memory device of claim 1, wherein each of the plurality of memory die comprises a same interface pad pattern.

3. The multi-chip memory device of claim 1, wherein the internal interface of at least one of the plurality of memory die comprises a low-power interface designed for inter-die communication in a single package.

4. The multi-chip memory device of claim 1, wherein the external interface comprises an interface configured according to a memory standard.

5. The multi-chip memory device of claim 4, wherein the memory standard is in accordance with a JEDEC DDRx standard.

6. The multi-chip memory device of claim 1, wherein the plurality of memory die comprise DRAM.

7. The multi-chip memory device of claim 6, wherein the memory controller and interface die comprises DRAM support circuitry.

8. The multi-chip memory device of claim 7, wherein the DRAM support circuitry comprises a self-refresh controller, the self-refresh controller comprising an output coupled to the plurality of memory die.

9. The multi-chip memory device of claim 1, wherein the memory controller and interface die further comprises a redundancy for repair block.

10. The multi-chip memory device of claim 4, wherein the memory standard is in accordance with a XDR standard.

11. A packaged memory device comprising:
   a first memory die comprising a DRAM memory array and an internal memory interface, the internal memory interface comprising an address and data interface; and
   a memory controller and interface die stacked with the first memory die, the memory controller and interface die comprising
      an internal memory interface bonded to the internal memory interface of the first memory die, and
      DRAM memory support circuitry coupled to the first memory die; and
   a plurality of external interface pins coupled to an external interface of the memory controller and interface die, the external interface of the memory controller and interface die operable according to a DRAM memory interface standard.

12. The packaged memory device of claim 11, wherein the external interface operates in accordance with a JEDEC DDRx standard.

13. The packaged memory device of claim 11, further comprising a second memory die stacked with the first memory die and the memory controller and interface die, wherein the second memory die comprises:
   a substantially similar die as the first memory die; and
   an internal interface coupled to the internal memory interface of the memory controller and interface die and the internal memory interface of the first memory die.

14. A method of operating a stacked memory device comprising a memory controller and interface integrated circuit stacked with at least one memory integrated circuit, the method comprising reading the memory, the reading comprising:
   providing a read instruction to an external interface of the memory controller and interface integrated circuit, the read instruction comprising an address and read command according to a memory interface standard;
   issuing a read command from the memory controller and interface integrated circuit to an internal memory bus coupled to the at least one memory integrated circuit, wherein the internal memory bus comprises bonded connections coupling the memory controller and interface integrated circuit to the at least one memory integrated circuit;
   transmitting read data from the at least one memory integrated circuit on the internal memory bus to the memory controller and interface integrated circuit; and
   outputting the read data from the memory controller and interface integrated circuit to the external interface.

15. The method of claim 14, further comprising writing the memory, the writing comprising:
   providing a write instruction and write data to an external interface of the memory controller and interface integrated circuit, the write instruction comprising an address and write command according to the memory interface standard;
   issuing a write command and the write data from the memory controller and interface integrated circuit to the internal memory bus coupled to the at least one memory integrated circuit; and
   writing the write data to the at least one memory integrated circuit on the internal memory bus.

16. The method of claim 15, further comprising:
generating a plurality of memory support signals on the memory controller and interface integrated circuit; and
outputting the plurality of memory support signals to the at least one memory integrated circuit.

17. The method of claim 16, wherein the memory support signals comprise power supply voltages.

18. A memory system comprising:
a plurality of memory cells arranged in arrays of rows and columns, the arrays being distributed among a plurality of memory chips, each memory chip including a separate semiconductor die; and
support circuitry disposed on a memory controller and interface chip that is a separate die from the memory chips, the support circuitry including on die-termination circuitry such that none of the plurality of memory chips have any on-die termination (ODT) circuitry, wherein the plurality of memory chips and the memory controller and interface chip are housed in a single semiconductor package.

19. A memory system comprising:
a plurality of memory cells arranged in arrays of rows and columns, the arrays being distributed among a plurality of memory chips, each memory chip including a separate semiconductor die; and
support circuitry disposed on a memory controller and interface chip that is a separate die from the memory chips, the support circuitry including a first power supply generation circuit electrically coupled to the plurality of memory chips, such that none of the plurality of memory chips have a first power supply generation circuit, wherein the plurality of memory chips and the memory controller and interface chip are housed in a single semiconductor package.

20. A method of operating a stacked memory device comprising a memory controller and interface integrated circuit stacked with at least one memory integrated circuit, the method comprising reading the memory, the reading comprising:
providing a read instruction to an external interface of the memory controller and interface integrated circuit, the read instruction comprising an address and read command according to a DDRX memory interface standard;
issuing a read command from the memory controller and interface integrated circuit to an internal memory bus coupled to the at least one memory integrated circuit according to a XDR memory interface standard, wherein the internal memory bus comprises bonded connections coupling the memory controller and interface integrated circuit to the at least one memory integrated circuit;
transmitting read data from the at least one memory integrated circuit on the internal memory bus according to the XDR memory interface standard to the memory controller and interface integrated circuit; and
outputting the read data from the memory controller and interface integrated circuit to the external interface according to a DDRx memory interface standard.

21. The method of claim 20, further comprising writing the memory, the writing comprising:
providing a write instruction and write data to an external interface of the memory controller and interface integrated circuit, the write instruction comprising an address and write command according to the DDRx memory interface standard;
issuing a write command and the write data from the memory controller and interface integrated circuit according to the XDR memory interface standard to the internal memory bus coupled to the at least one memory integrated circuit; and
writing the write data to the at least one memory integrated circuit on the internal memory bus.

22. A memory system comprising:
a common package having a plurality of external contacts;
an internal memory bus included in the common package;
a plurality of memory die included in the common package, each of the plurality of memory die comprising a memory array, support circuitry and an input/output interface coupled to the internal memory bus;
a memory controller and interface die included in the common package separate from the plurality of memory die, the memory controller and interface die comprising a first input/output interface coupled to the internal memory bus and a second input/output interface coupled to the plurality of external contacts of the common package so that the second input/output interface of the memory controller and interface die can be coupled to an external memory bus disposed external to the common package via the plurality of external contacts.

23. The memory system of claim 22, wherein the memory controller and interface die is stacked over the plurality of memory die within the common package.

24. The memory system of claim 22, wherein the internal memory bus comprises a plurality of signal lines comprising bonded connections coupled to the plurality of memory die and the memory controller and interface die.

25. The memory system of claim 22, wherein the internal memory bus comprises a plurality of signal lines comprising silicon through vias coupled to the plurality of memory die and the memory controller and interface die.

26. The memory system of claim 22, wherein the memory controller and interface die comprises support circuitry coupled to the plurality of memory die via the internal memory bus.

27. The memory system of claim 26, wherein the support circuitry comprises:
a clock generation circuit;
a memory test circuit
an error correction circuit; and
a voltage or current supply generation circuit.

28. The memory system of claim 22, wherein the memory controller and interface die comprises a plurality of memory interface macros, wherein each memory interface macro comprises:
a first external interface targeted toward a first particular memory standard; and
a second external interface targeted toward a second particular standard, the second standard different from the first standard.

29. The memory system of claim 28, wherein the first external interface is configured to operate according to a first JEDEC standard and the second external interface is configured to operate according to a second JEDEC standard.

30. The memory system of claim 22, wherein each of the plurality of memory die comprises a bare die, the bare die comprising a semiconductor circuit.

31. The memory system of claim 22, wherein at least one of the memory controller and interface die and the plurality of memory die is included in a separate package disposed within the common package.

* * * * *